United States Patent [19]
Mowry

[11] Patent Number: 4,851,944
[45] Date of Patent: Jul. 25, 1989

[54] GANGED MR HEAD SENSOR

[75] Inventor: Gregory S. Mowry, Burnsville, Minn.

[73] Assignee: Magnetic Peripherals Inc., Minnetonka, Minn.

[21] Appl. No.: 152,783

[22] Filed: Feb. 5, 1988

Related U.S. Application Data

[63] Continuation-in-part of Ser. No. 15,200, Feb. 17, 1987, and a continuation-in-part of Ser. No. 15,203, Feb. 17, 1987, abandoned.

[51] Int. Cl.$^4$ .......................... G11B 5/39; G11B 5/127
[52] U.S. Cl. .................................................... 360/113
[58] Field of Search ................ 360/113, 110; 324/252; 338/32 R

[56]  References Cited
U.S. PATENT DOCUMENTS 3,887,944  6/1975  Bajorek et al. ...................... 360/113
3,967,368  7/1976  Brock et al. ........................ 360/113
4,713,708  12/1987  Krounbi et al. ..................... 360/113

FOREIGN PATENT DOCUMENTS 0218617  12/1984  Japan ................................. 360/113

Primary Examiner—Stuart N. Hecker
Assistant Examiner—David J. Severine
Attorney, Agent, or Firm—Edward P. Heller, III

[57] ABSTRACT

A single magnetoresistive element ganged MR head sensor. The sensor is comprised of a single magnetoresistive element divided into a plurality of sense regions by more than two electrical contacts, the facing sides of each being parallel to each other and perpendicular to the lower edge of the element. No other transverse biasing is applied and the sensor operates in a non linear mode. The provision of no transverse biasing reduces cross talk.

1 Claim, 2 Drawing Sheets

GANGED MR HEAD SENSOR

This application is a continuation-in-part of Mowry, G., Ser. No. 015,200, filed 02/17/87, entitled "Non Linear Magnetoresistive Sensor", and Mowry, G. Ser. No. 015,203, filed 02/17/87, now abandoned entitled "Magnetoresistive Sensor Having Antiferromagnetic Exchanged-Biased Ends", which are hereby incorporated by reference.

FIELD OF THE INVENTION

The invention relates to the field of magnetoresistive ("MR") sensor elements and more particularly to those intended to be incorporated into magnetoresistive heads.

BRIEF DESCRIPTION OF THE PRIOR ART

As the performance of computer systems continues to increase, so does the demand for storage capacity and data transfer rate of computer peripherals. In Winchester disk drives, one proposal for accomplishing these objectives is to provide read heads which read data in parallel, i.e., read recorded information on two or more tracks simultaneously. Such read heads are known as ganged read heads. One example is shown in "Narrow Track Magnetoresistive Transducer Assembly", U.S. Pat. No. 4,356,523 to Yeh, assigned to Ampex Corporation.

This latter reference describes the typical approach for ganged MR heads. Each MR head comprises a separate element (here a coupled set of vertically oriented elements 10,11) mounted in a larger apparatus. See e.g., FIGS. 4 and 5. No known ganged MR head employs a single element MR stripe.

SUMMARY OF THE INVENTION

The invention comprises a single element MR stripe divided into a plurality of sense regions by more than two electrical contacts. The sense regions are arranged such that when the sensor is disposed in a read head opposite a recording medium, they will simultaneously sense magnetic flux from a plurality of adjacent recorded tracks with a minimum of cross talk. The stripe's easy axis of magnetization is in the longitudinal direction, parallel to the recording medium. Contacts are applied to the stripe with vertically aligned sides so as to apply no canted current biasing. Further, no other transverse, hard axis biasing is applied so that the sensor operates in a non linear mode. The provision of no transverse biasing field reduces cross talk because of the inherent magnetic relaxation of single element MR stripes. In a second approach, cross talk transmission is eliminated by exchange-coupling antiferromagnetic material to the stripe in the contact regions.

DESCRIPTION OF THE PREFERRED EMBODIMENT

Figure 1:
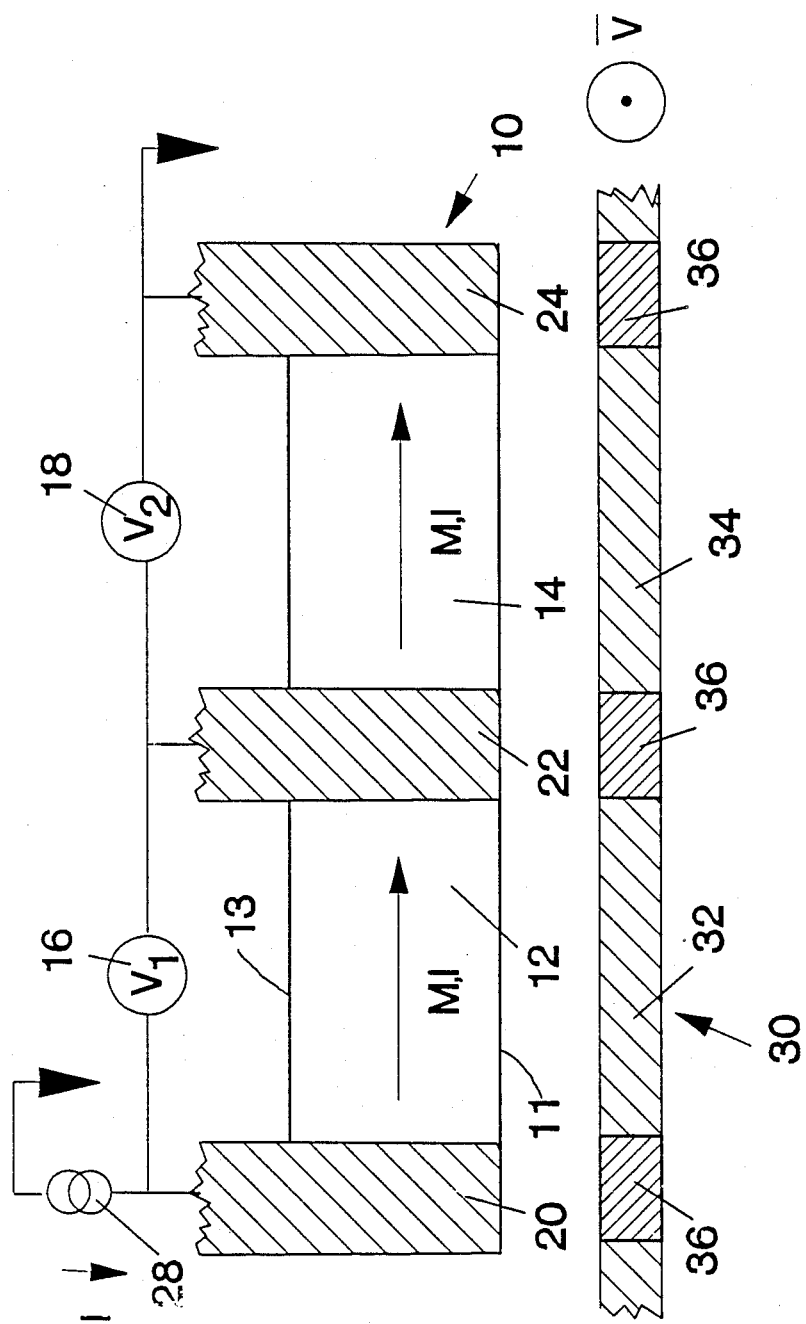
FIG. 1 is a plan view of the single element MR stripe according to a first embodiment of the present invention, with partial view of the contacts, a brief schematic of the sense circuit, and a cross section of a recording surface with a representation of the tracks where data is recorded and their guard band separations.

FIG. 1 illustrates a preferred embodiment of the single element ganged MR head according to the present invention. While only two sense regions 12,14 for sensing two data tracks 30,32 are shown, the inventive concept can be extended to any number of sense regions and tracks. Further, while the invention is described in relation to data tracks having guard bands 36, the invention is also useful for reading servo tracks (not shown) by proper electronic switching.

For example, if proper servo track information is written in track regions 32 and 34, then by subtracting signal output $V_1$ from signal output $V_2$, a linear offtrack error voltage versus position can be generated. The resulting error voltage provides the necessary input for track following electronics to minimize track misregistration.

In the Figure, the single element magnetoresistive ("MR") element 10 is conventionally Composed of 80:20 NiFe alloy. The element 10 has upper 13 and lower 11 edges parallel to each other and, when mounted in a read head (the other elements of which are not shown for the purpose of clarity), are also parallel to a flat recording media 30. (In some devices a head will fly a short distance above the media, such as in Winchester disk drives. In other types, the read head will be mechanically fixed in relation to the recording media, such as in tape drives.) The easy axis of magnetization of the element 10 is directed parallel to these upper and lower edges, as indicated by the vectors M shown in the Figure.

The MR element is divided into two sense regions 12,14 by contacts 20, 22 and 24 connected to the element on one side thereof. (In FIG. 2 the contacts are connected to the other side of MR element 10.) In those portions of the contacts connected to the MR element 10, the facing sides of the contacts are parallel to each other and perpendicular to the lower edge 11 of the MR element 10.

When properly aligned above the recording media 30 by conventional mechanical or servo means (not shown) the longitudinal dimensions of a sense region 12,14 between facing contacts 20, 22, and 24 is nominally the width of a track 32, 34 in which data has been magnetically prerecorded. Data tracks are conventionally separated by guard bands 36. The width of contacts 20, 22 and 24 is nominally that of the guard bands 36.

In operation, recording media 30 is in motion relative to ganged MR head in the direction shown by vector V. Data recorded along the track in the form of magnetic flux transitions passes serially under a sense region and causes a localized change in resistivity which can be electronically sensed and converted into data.

A current source is connect to a first end conductor 20 and a current drain is connected to a second end conductor 24. So connected, current I flows through the MR element 10 in the direction indicated by vectors I. Further, a first voltage sensor 16 is connected between the first end contact 20 and a center contact 22; and a second voltage sensor 18 is connected between the center contact 22 and the second end contact 24. The voltage drop across sense region 12 is sensed by the first sensor 16 and the voltage drop across the other sense region 14 is sensed by the second voltage sensor 18. As will be appreciated by those skilled in the art, the voltage drop across the respective regions will change according to the magnetic fields in the sense regions originating from the recording media 30 (and tracks 32, 34 when the ganged MR head is properly aligned above them).

Because the facing sides of the contacts 20, 22 and 24 are parallel, no canted current biasing is present. Further, no external biasing fields are provided to cant the magnetic vector M. This arrangement results in the output of from voltage sensors 16 and 18 being a non linear function of the input magnetic fields from recording surface 30. However, as disclosed in the above referenced application Ser. No. 015,200, in the context of data recording where the location of a data magnetic transition is important rather than its strength or polarity, a non linear sensor operation is actually preferred. Moreover, the provision of no external magnetic biasing fields permits the operation of magnetic relaxation of the MR elements. This inherently reduces the transmission of the effects of a localized magnetic perturbation through the MR element. As a result cross talk from adjacent tracks is reduced. This permits tracks to be recorded far more closely together than would otherwise be expected. In the embodiment shown in FIG. 1, sufficient signal to noise ratio exists with conventional low noise thin film media recorded conventionally with data yielding a 300 gauss peak magnetic field at the medium surface with the MR elements spaced (i.e. flying or mechanically fixed) from the recording media 30 a distance of 0.05–0.25 μm such that the distance between the facing surfaces of contacts 20, 22 and 24 can be in the range of 2 to 4 μm and the width of the contacts 20, 22 and 24 being in the range of 1 to 2 μm, with the tracks 32, 34 and guard bands being of corresponding dimensions, such that 6000 tracks per inch can be read.

Figure 2:
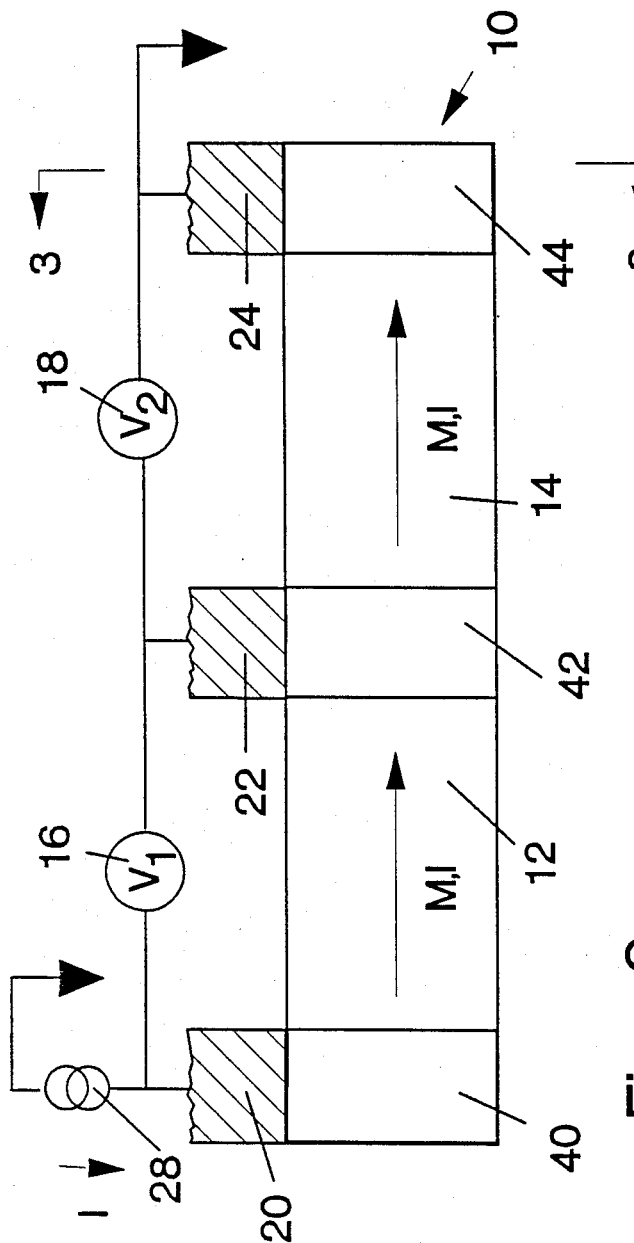
FIG. 2 is a plan view of a second embodiment of the present invention, showing the exchange-coupled antiferromagnetic material coupled to the single-element stripe in the region of the contacts, which are shown here behind the stripe.
Figure 3:
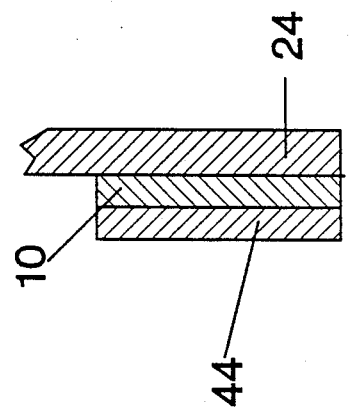
FIG. 3 is a cross section along 3—3 of FIG. 2.

FIG. 2 illustrates a second embodiment of the present invention in which cross talk is even further reduced thereby permitting even greater track density. This embodiment is essentially the same as that of FIG. 1, with the addition of antiferromagnetic material exchange-coupled to the single-element MR stripe 10 in the region of contacts 20, 22 and 24, but on the opposite side of the stripe 10 therefrom. (Deposition of the antiferromagnetic material on the opposite side of the contact is not necessary if the antiferromagnetic material is a conductor.) Thus in FIG. 2, antiferromagnetic material, which is conventionally 50:50 FeMn, is exchange-coupled to the stripe 10 at 40, 42 and 44 to cover substantially the same area of the stripe as the corresponding contacts 20, 22 and 24, but on the opposite side of the stripe 10, as shown in FIG. 3, a cross section along 3—3 of FIG. 2.

This exchange-coupled material "freezes" the magnetic orientation of the MR material to which it is coupled. This effectively prevents a magnetic perturbation induced in one sense region 12,14 from being transmitted through the element to the to other sense region 14,12. Thus cross talk is reduced to only that caused by the direct influence of one track, e.g. 32, on an adjacent sense region, e.g., 14.

I claim:

1. An unbiased single magnetoresistive element ganged read head sensor comprising:
    an elongated magnetoresistive element;
    a plurality of sense current contacts contacting the element and defining a plurality of sense regions between the contacts, the regions of the element in the contact area being maintained with substantially the same coercivity as that of the sense regions; and
    no external magnetic field transverse biasing means therby operating the ganged read head sensor in a non-linear range.

* * * * *